(12) United States Patent
Floman et al.

(10) Patent No.: US 7,142,479 B2
(45) Date of Patent: Nov. 28, 2006

(54) ADDRESSING DATA WITHIN DYNAMIC RANDOM ACCESS MEMORY

(75) Inventors: Matti Floman, Kangasala (FI); Jani Klint, Tampere (FI)

(73) Assignee: Nokia Corporation, Espoo (FI)

( * ) Notice: Subject to any disclaimer, the term of this patent is extended or adjusted under 35 U.S.C. 154(b) by 193 days.

(21) Appl. No.: 10/828,515

(22) Filed: Apr. 19, 2004

(65) Prior Publication Data

US 2005/0235066 A1    Oct. 20, 2005

(51) Int. Cl.
*G11C 8/06* (2006.01)
*G11C 8/10* (2006.01)
*G11C 8/18* (2006.01)

(52) U.S. Cl. ............ 365/233; 365/230.06; 365/230.08; 711/200; 711/220

(58) Field of Classification Search ................ 365/233, 365/230.06, 239, 240, 230.08, 230.09, 219, 365/230.02; 711/200, 220
See application file for complete search history.

(56) References Cited

U.S. PATENT DOCUMENTS

| 5,077,693 | A | * | 12/1991 | Hardee et al. ......... 365/230.08 |
| 5,428,770 | A | * | 6/1995 | Garner ....................... 714/733 |
| 5,499,385 | A | | 3/1996 | Farmwald et al. |
| 5,517,459 | A | * | 5/1996 | Ooishi ................... 365/230.08 |
| 5,657,288 | A | * | 8/1997 | Dent ...................... 365/230.02 |
| 5,815,510 | A | * | 9/1998 | Jones et al. ................. 714/724 |
| 6,292,403 | B1 | | 9/2001 | Pancholy et al. |

* cited by examiner

*Primary Examiner*—J. H. Hur
(74) *Attorney, Agent, or Firm*—Alfred A. Fressola; Ware, Fressola, Van Der Sluys & Adolphson LLP

(57) ABSTRACT

A method for addressing dynamic random access memory, with providing a row address and a column address to addressing terminals of the memory, in intervals provided by a timing clock signal, to allow increasing address bus bandwidth without increasing the number of address terminals; the inventive method provides—dividing the row address and/or the column address into parts, and providing the respective parts to the address terminals at a rising, and a falling edge of the timing clock signal.

19 Claims, 3 Drawing Sheets

ADDRESSING DATA WITHIN DYNAMIC RANDOM ACCESS MEMORY

FIELD OF THE INVENTION

The invention relates to a method for addressing dynamic random access memory, with providing a row address and column address to addressing terminals of the memory, in intervals provided by a timing clock signal.

The invention also relates to a computer-program product with a computer program stored thereon for providing address information to a memory device for accessing data within the memory device, the program comprising instructions operable to cause a processor to, provide a row address and a column address to addressing terminals of the memory device sequentially.

Further the invention relates to a computer system comprising a central processing unit (CPU) and a memory device with an address bus providing row address and column address from the CPU to the memory device sequentially, and a clocking device providing a timing clock signal or strobe(s) with rising and falling edges.

In addition, the invention relates to a computer-program product with a computer program stored thereon for providing address information to a memory device for accessing data within the memory device, the program comprising instructions operable to cause a processor to provide a row address and a column address to addressing terminals of the memory device sequentially.

Finally, the invention relates to a mobile communication device with an inventive memory device and the use of the inventive memory device in consumer electronics.

BACKGROUND OF THE INVENTION

Memory technology implies the need for accessing data within memory devices, such as random access memory or other memory devices. Therefore, different addressing strategies have already been proposed.

Exemplarily for dynamic random access memory (DRAM) chips, data is stored well organized within arrays of rows and columns. This may be achieved using memory cells, organized as a matrix. Each memory block, e.g. each bit within the memory, may thus have a distinctive address. This address may be provided by a row address and a column address.

Accessing the rows and columns is possible using a row and column address, provided by respective signals via an addressing interface. The addressing interface provides a number of address terminals, e.g. connection pins, which number may correspond to the bandwidth of the address bus. For instance, a bit address bus with a bandwidth of 13 bit may be supported by 13 single address terminals of the memory device.

To select the respective memory blocks, address signals may be provided at the interface. The column may be addressed by a column address strobe (CAS). The row is addressed by a row address strobe (RAS).

For accessing the data, the central processing unit may provide via the addressing bus the row address strobe for selecting the correct row. After receiving the row address strobe, the respective row may be selected from the respective array within the memory device. The selected row may then be sensed from the array. There might be a delay for retrieving the row data from the memory. This time for reading the row and sensing the data and the delay may be called RAS-to-CAS-delay.

By providing the column address strobe after that, the respective column may be selected from the data buffer. The corresponding memory block, the piece of data which corresponds to the respective row and column within the memory, may thus be read from the memory and provided for further processing on a data bus.

In particular within dynamic random access memory (DRAM), data need to be refreshed after a while. Therefore, it is known to write data of a row, which has been cached in a cache, register, buffer or any other memory, back to the respective memory row within the memory device. This allows refreshing the memory.

A full read/write timing clock cycle for accessing memory may insofar include the time for transmitting the row address strobe, the time for the RAS-to-CAS-delay, the time for transmitting the column address strobe, and the time of the CAS-latency. The length of a read/write timing clock cycle may also depend on the clocking of the bus. One read/write timing clock cycle may only be expressed in integers of clocking intervals.

By multiplexing the RAS and CAS onto one interface, the number of pins may be reduced. Multiplexing may be understood as providing the RAS and CAS one after the other to the respective address terminals via the address bus. Nevertheless, the number of address terminals needs to correspond to the bandwidth of the address bus.

However, the number of pins at the address terminal is getting more critical, since new application designs require broader address bus bandwidth. Doubling the bandwidth of the address bus would require doubling the number of address terminals. As the package size of memory devices is required to be small, increasing the number of pins is hardly to implement.

SUMMARY OF THE INVENTION

To overcome the above-mentioned problems the invention provides a method for addressing dynamic random access memory, with providing a row address and a column address to addressing terminals of the memory, in intervals provided by a timing clock signal or strobe(s), characterized in dividing the row address and/or the column address into parts, and providing the respective parts to the address terminals at a rising, and a falling edge of the timing clock signal or strobe(s).

According to the invention, the row address and/or the column address may be divided into two or more parts, which may then be sent temporarily in sequence to the addressing terminals. According to the invention, the addressing terminals may be provided with the row address and/or the column address on both edges of the timing clock signal or both edges of the strobe(s). This signal has a rising and a falling edge. A timing clock period may be understood as a signal of one rising and one falling edge, which may be repeated harmonically.

According to embodiments of the invention, both the rising and the falling edge of the timing clock signal, according to embodiments the signal or any other clock signal such as strobe signal(s), may be used to provide the address information to the address terminals. By that, the number of needed pins may be reduced. The reduction of the number of pins depends on the number of parts the row and/or column address is divided into.

As the row address and/or the column address is provided in parts, there may be a delay during address delivery from CPU to the memory device. The row address may be provided with a delay of half or more than half a timing clock cycle.

However, this delay may be regarded as insignificant. In addition, when for instance two parts of the column address are provided, these may still be delivered after one full clock period.

According to embodiments of the invention, the respective parts are provided to the address terminal at consecutive rising and falling edges of the timing clock signal or strobe signal(s). By providing the respective parts at consecutive rising and falling edges, the delay may be reduced to a minimum. The inventive method allows removing limitations created by a fixed number of pins and also allows increasing memory capacity without increasing the number of pins.

According to embodiments of the invention, dividing the row address into two parts is provided. By providing the two parts of the row address, respectively, at a first rising edge and a first falling edge within a timing clock cycle of the timing clock signal, the delay of address delivery of the row address may be reduced to a minimum.

Also provided according to embodiments of the invention is dividing the column address into two parts. In such a case providing the two parts of the column address, respectively, after a delay or latency time for processing the row address, at a first falling edge and a following rising edge within a timing clock cycle of the timing clock signal allows providing the column address without any delay compared to common memory addressing.

According to these embodiments, after the RAS-to-CAS-delay, the first part of the column address may already be provided at the first falling edge within the timing cycle of the timing clock signal. Then, by providing the remaining part of the column address at the following rising edge, allows providing the complete column address without delay compared to common memory addressing.

In particular, buffering the row data into a memory provides a latency for processing the row address of two rising edges, according to embodiments.

To reduce the number of pins by more than half, embodiments provide dividing the row address and/or the column address into more than two parts.

Minimising delay of row address delivery is provided according to embodiments by providing the parts of the row address at rising and falling edges at the beginning of a timing clock cycle of the timing clock signal, respectively.

Reducing delay of column address delivery is possible by providing the parts of the column address after a latency time for processing the row address at the falling and rising edges at the end of a timing cycle of the timing clock signal, respectively, according to further embodiments.

According to embodiments of the invention, a latency of two rising edges for processing the column address is provided. This latency allows refreshing the memory with the row data by writing back the data.

Internal processing within the memory of the divided address information is provided by embodiments by processing the parts of the row address and/or the parts of the column address sequentially at the address terminals within the memory. According to these embodiments, the parts are re-assembled after being received completely and then processed accordingly.

Increasing retrieval of row data is possible by processing parts of the row address within the memory before receiving the complete row address, as provided by embodiments. By that, a pointer may already be calculated pointing to a certain area within the memory and then from this area the respective row may be selected after the complete row address as been received.

A further aspect of the invention is a dynamic random access memory device comprising address terminals for receiving address information, and address processing means for processing received row address and column address received via the address terminal, characterised in that the address processing means receive at least parts of the row address and/or column address at rising and falling edges of a timing clock signal, respectively.

The number of address terminals may be reduced in as much as a number of address terminals T is the address bus size ADR divided by an integer N such that $$T = \left\lceil \frac{ADR}{N} \right\rceil.$$

By that, the ceiling of $$\frac{ADR}{N}$$

may be used to calculate the required number of pins. For instance, in case the address bus size is 13 bit, the number of terminals may be reduced to 7 for N=2. For an address bus size 14, the number of pins may also be 7 for N=2. N may be an integer representing the number of parts the row address and/or the column address is divided into.

In case longer delays are acceptable, more pins may be saved. For instance, with one clock delay the amount of needed pins may be reduced to 4. In such a case, the address information is divided into N=4 parts. This results in $$T = \left\lceil \frac{13}{4} \right\rceil = 4.$$

To provide pre-loading of a memory, embodiments provide row data to a row buffer after the row address has be received. Another aspect is a computer system comprising a central processing unit (CPU) and a memory device, with an address bus providing row address and column address from the CPU to the memory device sequentially, a clocking device providing a timing clock signal with rising and falling edges, characterised by address processing means dividing the row address and/or the column address in parts, and providing the respective parts to address terminals of the memory device at rising and falling edges of the timing clock signal.

Further aspects of the invention are the use of an inventive device in consumer electronic devices and/or mobile communication devices, as well as mobile communication devices comprising such memory.

DETAILED DESCRIPTION OF THE DRAWINGS

Figure 1:
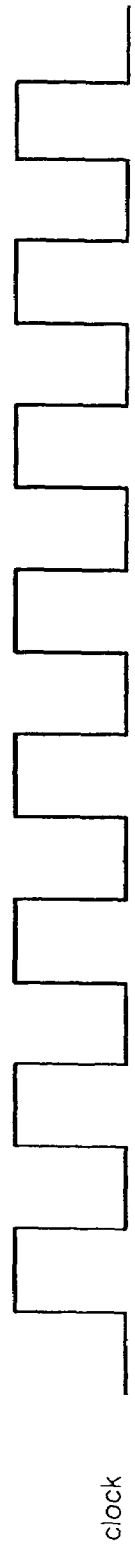
FIG. 1 a timing chart of a conventional memory addressing.
Figure 1:
Figure 1:

FIG. 1 shows a conventional timing chart for addressing memory within a dynamic random access memory (DRAM) device. The timing clock signal CLOCK is depicted as pulse signal. The timing may be done by strobe signal(s) (not depicted), which may be included in standard DDR, or a timing clock signal CLOCK, which is also a common clock signal for synchronising data transfer on the address bus.

Below the timing clock signal CLOCK, or similar signals, for instance strobe signal(s), the timing of data on the address bus ADDRESS is depicted. The timing of row address R signal and the column address C signal are depicted. These address signals may be RAS or CAS signals. As depicted, at a first rising edge of the timing clock signal CLOCK row address R is provided on address bus ADDRESS.

With this row address R, data within the respective row may be retrieved from the memory and stored within a sense amplifier. The latency due to sensing is accounted for by waiting two timing clock signal CLOCK cycles with two rising edges until the column address C signal is provided at the next rising edge of the timing clock signal CLOCK.

After a further latency of two rising edges, data D may be provided at the data bus, as depicted in the data bus DATA timing chart. As can be seen from the data bus DATA timing chart, the data bus DATA already provides information at both rising and falling edges of the timing clock signal CLOCK or strobe signal(s). After all data has been provided, the timing clock cycle may be repeated. The timing chart may then be repeated with a new row address R and a new column address C.

Figure 2:
FIG. 2 a timing chart of an inventive memory addressing.
Figure 2:
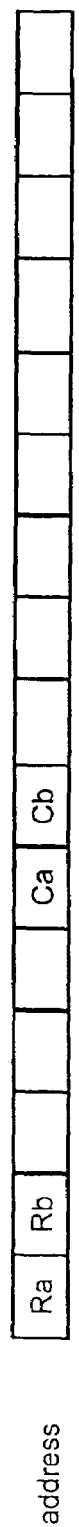
Figure 2:

Depicted in FIG. 2 is an inventive timing chart with the row address R being divided into two parts $R_a$, $R_b$ and the column address C being also divided into two parts $C_a$, $C_b$. By dividing row address R into the parts $R_a$, $R_b$ and column address C into the parts $C_a$, $C_b$, the number of pins at the address bus ADDRESS may be reduced by a factor of substantially two. In the depicted case, the number of parts N=2 and an exemplary address bus size ADR=13 results in the total number pins T according to an inventive embodiment as $$T = \left\lceil \frac{13}{2} \right\rceil = 4.$$

As can be seen from the timing chart at the beginning of the first rising edge the first part $R_a$ of the row address R is provided. After that, at the temporarily following falling edge of the timing clock signal CLOCK or strobe(s), the second part $R_b$ of the row address is provided. By that, with a latency of half a clock period, the complete row address R is provided. With a latency of two rising edges, the column address is provided within two parts, $C_a$, $C_b$.

As can be seen from FIG. 2, the first part $C_a$ of column address C is provided at the first falling edge after the latency of two rising edges. The column address may, however, consist of more than two parts. In such a case, it is possible, according to embodiments, that a first part may already be delivered earlier than the first falling edge, after the latency of two rising edges. The only limit for delivering the column address earlier may be that the row address needs to be fully delivered.

The second part $C_b$ of the column address C may then be provided at the temporarily consecutive rising edge. As can be seen from a comparison between FIG. 1 and FIG. 2, according to this embodiment, with the address information being divided into two parts, the row address R is provided with a latency of half a clock cycle and the column address C is provided at the same time as without division of the address information. The data is provided at the data bus DATA at the same time as without division of address information. Column address C is not delayed with half a clock cycle, since the controller or the central processing unit may start sending column address C half a clock period earlier then in case of standard addressing, as addressing is already possible during a falling edge.

Figure 3:
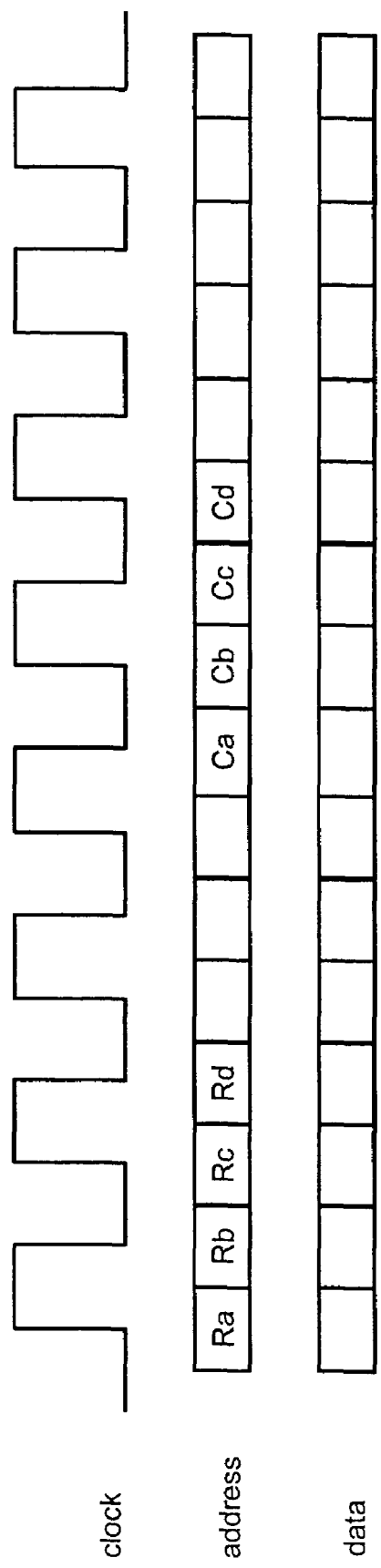
FIG. 3 a further timing chart of an inventive memory addressing.

FIG. 3 depicts a timing chart for embodiments with four parts of address information. As can be seen from FIG. 3, on address bus ADDRESS the four parts $R_a$, $R_b$, $R_c$, $R_d$ of row address R are provided at four first rising and falling edges of timing clock signal CLOCK or strobe signal(s). The delay for providing the row address R is one complete clock cycle.

A column address C is provided in four parts $C_a$, $C_b$, $C_c$, $C_d$ after a latency of two rising edges on address bus ADDRESS. Not depicted, however possible, is the delivery of the column address earlier than after a latency of two rising edges.

Not depicted is the provision of data D on data bus DATA after a further delay of two rising edges at the third consecutive rising edge, which follows the depicted clock cycle.

Figure 4:
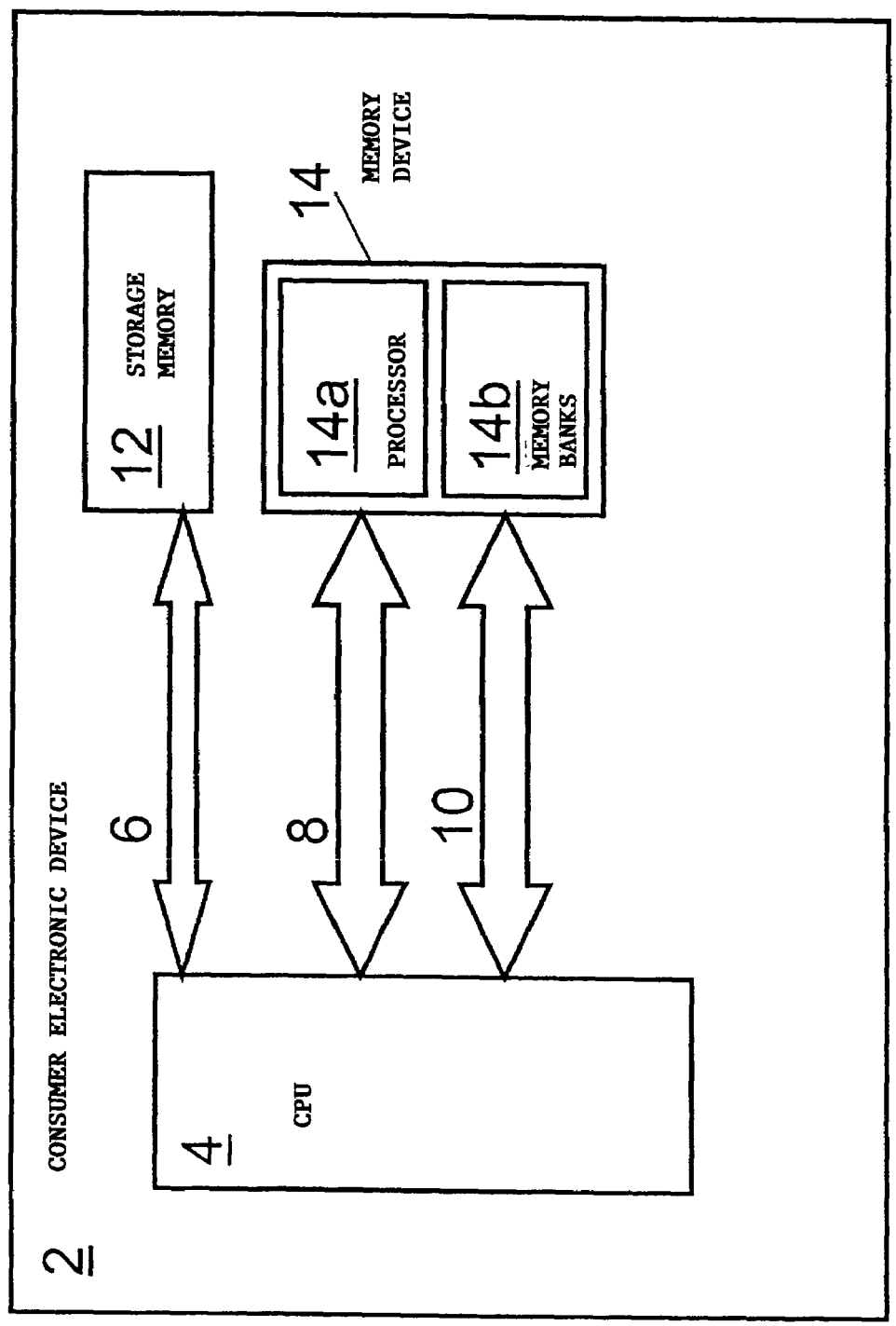
FIG. 4 an inventive electronic consumer device.

FIG. 4 depicts a consumer electronic device 2 comprising a central processing unit CPU 4, control and I/O bus 6 between CPU 4 and storage memory 12, address bus 8, data bus 10, and memory device 14. Memory device 14 comprises processor 14a, and memory banks 14b, storing the actual data.

Storage memory 12, which may for example be a computer program product, such as a data carrier, may provide a computer program via I/O bus 6 to central processing unit 4 for retrieving data from memory device 14. The computer program comprises instructions operable to process central processing unit 4 to provide memory device 14 via address bus 8 with row address and column address in a row address strobe (RAS) and a column address strobe (CAS), which signals are divided into two parts.

Each of the parts of the signals comprises a segment of the complete address information. Central processing unit 4 provides via address bus 8 first a first part of a row address at a rising edge of a clock signal (not depicted). The second part of the row address is provided via address bus 8 at the following falling edge of the clock signal.

After a timing delay, central processing unit 4 provides via address bus 8 at a following falling edge a first part of a column address and at the consecutive rising edge of the clock signal a second part of the column address.

By that, one particular memory block within a memory area may be selected. Processor 14a process the parts of the provided address information and retrieves the data from the respective data block of memory bank 14b. The retrieved data is provided by processor 14a onto data bus 10 and may be further processed by central processing unit 4.

By providing address information in parts, memory device 14 only needs to provide a reduced number of address terminals for a given address bus bandwidth. For instance, an address bus with 13 bit bandwidth only needs 7 terminals to provide the complete address in case the addresses are divided into two parts. This allows increasing address bus bandwidth without increasing the number of terminals of the memory device.

What is claimed is:

1. A method for addressing dynamic random access memory, comprising:
   providing a row address and a column address to addressing terminals of the memory, in intervals provided by a timing clock signal,
   dividing the row address into parts,
   dividing the column address into at least two parts, and
   providing the respective parts to the address terminals at a rising, and a falling edge of the timing clock signal with
   providing the first two parts of the column address, respectively, after a latency time for processing the row address at a first falling edge and a following rising edge within a timing cycle of the timing clock signal.

2. The method of claim 1, wherein the respective parts of the row address are provided to the address terminals at consecutive rising and falling edges of the timing clock signal.

3. The method of claim 1, with dividing the row address into two parts.

4. The method of claim 3, with providing the two parts of the row address, respectively, at a first rising edge and a first falling edge within a timing cycle of the timing clock signal.

5. The method of claim 1, with providing a latency of two rising edges for processing the row address.

6. The method of claim 1, with dividing the row address and/or the column address into more than two parts.

7. The method of claim 6, with providing the parts of the row address at rising and falling edges at the beginning of a timing cycle of the timing clock signal, respectively.

8. The method of claim 6, with providing the parts of the column address after a latency time for processing the row address at the falling and rising edges at the end of a timing cycle of the timing clock signal, respectively.

9. The method of claim 1, with providing a latency of two rising edges for processing the column address.

10. The method of claim 1, with processing the parts of the row address and/or the parts of the column address provided sequentially at the address terminals within the memory.

11. The method of claim 1, with processing parts of the row address within the memory before receiving the complete row address.

12. A dynamic random access memory device comprising
   address terminals for receiving address information, and
   an address processor configured to process received row address and column address received via the address terminals, as well as dividing the column address into at least two parts, wherein
   the address processor receives at least parts of the row address and/or column address at rising and falling edges of a timing clock signal, respectively, and provides the first two parts of the column address, respectively, after a latency time for processing the row address at a first falling edge and a following rising edge within a timing cycle of the timing clock signal.

13. The memory device of claim 12, where a number of the address terminals T is the address bus size ADR divided by N, such that, $$T = \left\lceil \frac{ADR}{N} \right\rceil.$$

where N is a positive integer of at least 2.

14. The memory device of claim 13, where N is the number of parts for the row address and/or the column address.

15. The memory device of claim 12, providing row data to a row buffer after the row address has been received.

16. A computer system comprising:
   a central processing unit,
   a memory device,
   an address bus providing row address and column address from the central processing unit to the memory device sequentially,
   a clocking device providing a timing clock signal with rising and falling edges,
   an address processor configured to divide the row address and/or the column address in parts, dividing the column address into at least two parts, and
   providing the respective parts to address terminals of the memory device at rising and falling edges of the timing clock signal with the providing the first two parts of the column address, respectively, after a latency time for processing the row address at a first falling edge and a following rising edge within a timing cycle of the timing clock signal.

17. A computer program product with a computer program stored thereon for providing address information to a memory device for accessing data within the memory device, the program comprising instructions operable to cause a processor to,
   provide a row address and a column address to addressing terminals of the memory device sequentially,
   divide the row address into parts,
   divide the column address into at least two parts, and
   provide the respective parts to the address terminals at a rising and a falling edge of a clock signal, with the providing the first two parts of the column address, respectively, after a latency time for processing the row address at a first falling edge and a following rising edge within a timing cycle of the timing clock signal.

18. A use of a memory device comprising
   address terminals for receiving address information, and
   an address processor configured to process received row address and column address received via the address terminals, as well as dividing the column address into at least two parts, wherein
   the address processor receives parts of the row address at rising and falling edges of a timing clock signal, respectively, and provides the first two parts of the column address, respectively after a latency time for processing the row address at a first falling edge and a following rising edge within a timing cycle of the timing clock signal in consumer electronic devices or mobile communication devices.

19. A mobile communication device comprising a memory device comprising:
   address terminals for receiving address information, and
   an address processor configured to process received row address and column address received via the address terminals, as well as dividing the column address into at least two parts, wherein the address processor receives parts of the row address at rising and falling edges of a timing clock signal, respectively, and provides the first two parts of the column address, respectively after a latency time for processing the row address at a first falling edge and a following rising edge within a timing cycle of the timing clock signal in consumer electronic devices or mobile communication devices.

* * * * *